Jan. 29, 1963 M. BAKER ETAL 3,075,866

METHOD OF MAKING PRINTED CIRCUITS

Filed June 19, 1958

INVENTORS
Mitchell Baker
Edward M. Van Wagner
BY
ATTORNEY

United States Patent Office 3,075,866
Patented Jan. 29, 1963

3,075,866

METHOD OF MAKING PRINTED CIRCUITS

Mitchell Baker and Edward M. Van Wagner, Rochester, N.Y., assignors to Xerox Corporation, a corporation of New York Filed June 19, 1958, Ser. No. 743,141
4 Claims. (Cl. 156—13)

Figure 1:

The present invention relates to improvements in electrical circuit construction and, particularly, to an improved method for producing electrical apparatus of the printed circuit type.

The many advantages of printed circuits are generally known, and one of the significant meritorious features of a printed circuit is that components, such as transistors, condensers, and like elements, can be quickly associated with the printed circuitry by a dip-soldering operation. In making basic printed circuit panels, it has heretofore been proposed to utilize a base of suitable insulating material in rigid sheet form and clad with conductive metal foil. To produce printed circuitry, it is customary to outline the circuit pattern on a foil-clad panel with an acid resistant material, generally referred to as resist. The panel is then treated with an acid solution which etches away the unprotected portions of the metal foil, the remaining portions of the foil forming the desired conductor pattern. The components are then mounted on the panel with their leads lying adjacent those points in the circuit conductors where electrical connections are to be made. Thereafter, the panel with the components arranged thereon, are electrically and structurally connected together as by soldering.

According to usual procedure, the material preferred for the insulating base is one of the phenolic plastics (for example, Bakelite) because such material is light in weight yet rugged in structure and can be readily worked or formed to accommodate mounting of various circuit components. A metal foil suitable to provide electrical conductors is bonded to the base panel. Although any suitable metal foil may be used, a copper foil is commonly used because of its ability to conduct electrical current and because of its ability to be wet by solder, the latter being necessary to permit soldering of components to the etched circuit. Generally, to insure satisfactory soldered connections, it is necessary to wash off the resist prior to the dip-soldering operation so that flux applied to the soldering points can be effective.

In the commercial production of printed circuit panels, considerable time may elapse between the steps of removing the resist and of dip soldering, during which time the exposed copper surfaces may become oxidized, thus requiring an additional cleaning step prior to application of flux and the solder-dipping operation. In any event, it will be apparent that removal of the resist alone increases the time required to produce the finished printed circuit panel and component assemblies.

It is the primary object of this invention to make it possible to effect a substantial saving in the operating time required to produce printed circuit assemblies.

Another and more specific object of this invention is to insure against oxidation of the copper portions of the printed circuit and, at the same time, to simplify the production of printed circuit assemblies.

The invention is further characterized by the novel manner in which the printed circuit panels are produced and the association of circuit components and conductor elements is accomplished.

These and other objects of the invention are obtained by applying to a copper clad substrate a negative toner resist image of the desired circuit, dip-soldering the exposed copper to form a solder image of the circuit, removing the toner resist and then etching the plate to remove the copper not protected by the solder, the solder acting as a resist during this etching process.

The invention will be more clearly understood from the following description, reference being made to the accompanying drawings wherein:

FIGS. 1–4, inclusive, are fragmentary, cross-sectional, elevational views illustrating the production of a printed circuit according to the invention.

Figure 5:
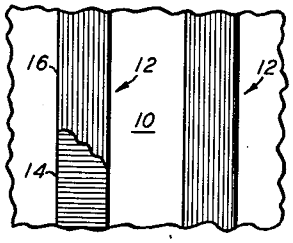

FIG. 5 is a plan view of a portion of a printed circuit made in accordance with the invention.

It is pointed out that the various figures are merely illustrative and are not intended to be limited to any specific circuit, and that the thickness of certain elements have been exaggerated for clarity of illustration.

Figure 4:
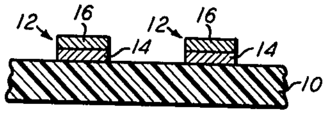

The printed circuit construction shown in FIGS. 4 and 5 includes a substrate plate or base 10 made from any suitable dielectric material having a circuit of conductor lines 12, in a desired pattern formed by a multiple layer of electrically conductive material, including a first layer of electrically conductive material 14 bonded to one side of the substrate plate or base 10, and a second layer of electrically conductive material 16, which is also a resist material, bonded to the first layer of electricaly conductive material 14 to form a unitary laminated structure.

The method of producing the printed circuit will be best understood by referring to FIGS. 1 to 4, inclusive, wherein FIG. 1 illustrates the dielectric substrate plate or base 10, the surface of which is plated with a first layer of electrically conductive material 14 over which there is applied a first resist material 18 in a negative pattern of the desired circuit.

Figure 2:
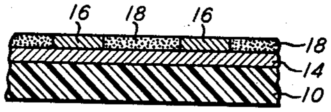
Figure 3:
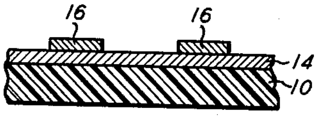

A second layer of electrically conductive material 16 is then bonded to the exposed portions of the first layer of electrically conductive material 14 as in FIG. 2. Since the first resist material 18 has been applied over the first layer of conductive material 14 as a negative pattern of the desired circuit, the application of the second layer of conductive material to the surface of the first layer of conductive material not protected by resist material 18 will produce a positive image of the desired circuit. The resist material 18 is then removed in any suitable manner to expose a portion of the first layer of conductive material 14, the remaining portion of the first layer of conductive material 14 being coated with a protective layer of conductive material 16 in the desired circuit pattern as seen in FIG. 3. The coated plate is then treated, as by etching, to remove the exposed or unprotected first layer of conductive material 14, the protected first layer of conductive material 14 forming with its protective covering of the second layer of conductive material 16, which acts as a resist in this last operation, the conductive lines 12, as shown in FIGS. 4 and 5.

A specific and preferred method, well adapted for making printed circuit panels in accordance with the invention, will now be described.

Because of its commercial availability as a prefabricated element or circuit board, a copper clad substrate plate is used in the preferred embodiment. In its well known form, the prefabricated element or circuit board consists of a sheet or film of copper bonded, as by cement (not shown since it forms no part of the invention), to a suitable substrate material. Prefabricated elements or circuit boards, having high resistance to temperatures up to say 500° F., are readily available commercially.

A negative resist image of the desired conducting lines is placed on the surface of the copper by a xerographic process. This consists of developing in a toner powder a negative image of the desired circuit on a xerographic plate. A transparent paper is then placed over the image and when a positive charge is placed on the back of the paper, the image is transferred to the paper. This paper, with the image thereon, is placed over the copper film and a negative charge is applied which forces the toner to the plate. The negative image is then fused. It has been found that a xerographic toner, such as that disclosed in Rheinfrank et al. Patent 2,788,288, when fused in place by exposure to trichloroethylene vapor, is a suitable resist material 18.

The substrate plate or base 10 with the pre-cleaned copper film and resist image thereon is then placed copper side down into contact with molten solder for a relatively short period of time to allow the unprotected copper to tin and then it is removed and allowed to cool. To obtain a suitable bond between the copper and solder, the copper should be cleaned by any one of a number of well-known methods before it comes into contact with the molten solder. This cleaning step may be done before placing the toner resist image on the copper, and it may be performed as a separate operation before dipping, or the copper may be cleaned by a high temperature liquid flux floating on top of the molten solder to permit the copper to be cleaned as it is dipped into the molten solder.

The resist material 18, that is, the toner resist, is then removed with liquid trichloroethylene leaving exposed portions of the copper film as shown in FIG. 3.

The unprotected copper is removed by dipping the plate in an aqueous ferric chloride etching bath of about 35° to 48° Baumé, preferably 42° Baumé. The solder is not affected by the ferric chloride and therefore acts as a resist material to protect portions of the copper film. After the exposed or unprotected copper is dissolved by the etching solution, the plate is removed from the solution to prevent undercutting, that is, to prevent etching of the copper from beneath the protective coating of solder. The panel may then be rinsed with water and dried.

In the above-described process, the ferric chloride does not affect the solder, and the toner is not affected by the solder, at least not sufficiently to destroy the negative resist image or to permit tinning of the copper protected by the toner.

In actual practice, using a toner of the type disclosed in Rheinfrank et al. Patent 2,788,288, it has been noticed that during vapor fusing of the toner image, the carbon particles in the toner drop to the surface of the copper through the vapor softened plastic pool and remain in resolution there while the liquid state plastic may run out of resolution. When the image on copper is placed face down on a molten solder pot, the plastics may be driven off while the carbon particles remain intact and prevent the solder from wetting the image area.

In this respect it is noted that the resist material used to protect the first layer of conductive material in the dip-soldering process must be capable of withstanding the temperature to which it is subjected in the solder bath, as, for example, a temperature of 375° F. when a 60% tin, 40% lead solder is used.

Component parts, such as transistors, condensers and like elements, necessary to complete a desired circuit may be added to the printed circuit panel in the usual manner by soldering to the conducting lines 12, which have been previously tinned in the fabrication of the panel.

Although the printed circuit has been described and illustrated as being formed on only one side of the substrate plate or base, it is apparent that the method disclosed can be applied to form circuits on both sides of the substrate plate or base, and it is also apparent that the method may be applied to a basic multiple clad substrate plate, as, for example, the method may be applied to form tinned copper contact areas of copper-aluminum conductors in a circuit of the type disclosed in Albright et al. Patents 2,777,192 and 2,777,193, issued January 15, 1957.

While the present invention, as to its objects and advantages, has been described herein as carried out in specific embodiments thereof, it is not desired to be limited thereby, but it is intended to cover the invention broadly within the spirit and scope of the appended claims.

What is claimed is:

1. A method of making an electrical circuit element including the steps of
electrostatically depositing a xerographic toner resist, in a negative image pattern of the desired circuit, on a copper clad dielectric base,
fusing the toner resist to said copper,
dip-soldering the portions of said copper not protected by the xerographic toner resist,
removing said xerographic toner resist,
and removing the portions of said copper not protected by solder in an etching solution.

2. A method of making a printed circuit including the steps of
electrostatically depositing xerographic toner resist in a negative image pattern of the desired circuit on an etchable layer of conductive metal, for which solder has an affinity, bonded to an insulating base, said conductive metal being of a thickness to constitute the desired conductive lines,
fusing the xerographic toner resist to said conductive metal,
dip-soldering the exposed surface of said conductive metal not protected by said xerographic toner resist by placing said conductive metal in contact with molten solder to tin the exposed surface of said conductive metal,
removing said xerographic toner resist,
and etching said conductive metal exposed by the removal of said xerographic toner resist to remove said conductive metal not protected by said solder.

3. In the method of forming a printed circuit having tinned conductive components on a laminate including a non-metallic substrate and a layer of conductive material wherein a resist material is applied to the conductive layer in a pattern to leave the desired printed circuit pattern exposed, and wherein a tinning metal is applied to the exposed printed circuit pattern, and wherein the resist material is removed and the untinned portions of the conductive layer are etched away,
the improvements comprising
forming the resist pattern xerographically by the application of a xerographic toner powder to the conductive layer in image configuration corresponding to a negative pattern of the desired printed circuit,
fusing the xerographic powder image onto the conductive layer,
and applying the tinning material to the exposed printed circuit pattern by dip-soldering.

4. In the method of forming a printed circuit having tinned conductive components on a laminate including a non-metallic substrate and a layer of conductive material wherein a resist material is applied to the conductive layer in a pattern to leave the desired printed circuit pattern exposed, and wherein a tinning metal is applied to the exposed printed circuit pattern, and wherein the resist material is removed and the untinned portions of the conductive layer are etched away,
the improvements comprising
forming a xerographic toner powder image of the resist pattern xerographically,
electrostatically transferring the xerographic toner powder image to the conductive layer to form a xerographic toner powder resist pattern in image configuration corresponding to a negative pattern of the desired printed circuit,
fusing the xerographic powder image onto the conductive layer,
and applying the tinning material to the exposed printed circuit pattern by dip-soldering.

(References on following page)

References Cited in the file of this patent

UNITED STATES PATENTS

| | | |
|---|---|---|
| 1,974,011 | Burgess | Sept. 18, 1934 |
| 2,202,295 | Marshall | May 28, 1940 |
| 2,587,568 | Eisler | Feb. 26, 1952 |
| 2,728,693 | Cado | Dec. 27, 1955 |
| 2,912,312 | Japel | Nov. 10, 1959 |
| 2,919,179 | Van Wagner | Dec. 29, 1959 |

FOREIGN PATENTS

| | | |
|---|---|---|
| 217,285 | Australia | May 30, 1957 |

OTHER REFERENCES

Kent: "The Potential of Printed Circuitry in Major Appliances," 1956, Finish; October 1956.

"1954 Why Wire?", publication published by Photocircuits Corp., Glen Cove, New York.